US011334457B1

(12) United States Patent
Shin et al.

(10) Patent No.: US 11,334,457 B1
(45) Date of Patent: May 17, 2022

(54) SEMICONDUCTOR MEMORY DEVICE AND MEMORY SYSTEM INCLUDING THE SAME

(71) Applicant: Samsung Electronics Co., Ltd., Suwon-si (KR)

(72) Inventors: Hohyun Shin, Hwaseong-si (KR); Jongwan Kim, Suwon-si (KR); Hyungi Kim, Anyang-si (KR); Hyunsung Shin, Seoul (KR); Dongmin Kim, Seoul (KR); Myeongo Kim, Hwaseong-si (KR); Kwangil Park, Yongin-si (KR); Youngsoo Sohn, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 231 days.

(21) Appl. No.: 16/839,675

(22) Filed: Apr. 3, 2020

Related U.S. Application Data

(60) Provisional application No. 62/867,440, filed on Jun. 27, 2019.

(51) Int. Cl.
G06F 11/00 (2006.01)
G06F 11/20 (2006.01)
G06F 11/07 (2006.01)
G11C 29/00 (2006.01)
G11C 15/04 (2006.01)
G11C 11/412 (2006.01)

(52) U.S. Cl.
CPC ...... *G06F 11/2094* (2013.01); *G06F 11/0727* (2013.01); *G11C 29/76* (2013.01); *G06F 2201/82* (2013.01); *G11C 11/412* (2013.01); *G11C 15/04* (2013.01)

(58) Field of Classification Search
CPC ............ G06F 11/0727; G06F 11/1016; G06F 11/2094; G11C 29/76
See application file for complete search history.

(56) References Cited

U.S. PATENT DOCUMENTS

| 6,101,614 | A | 8/2000 | Gonzales et al. |
| 7,203,889 | B2 | 4/2007 | Oza et al. |
| 7,543,220 | B2 | 6/2009 | Honda et al. |
| 7,587,625 | B2 | 9/2009 | Alexander et al. |
| 7,882,323 | B2 | 2/2011 | Allison et al. |
| 9,081,693 | B2 | 7/2015 | Ramaraju et al. |
| 9,928,128 | B2 | 3/2018 | Barrick et al. |
| 2016/0004587 | A1* | 1/2016 | Agrawal ............... G06F 3/0673 714/6.11 |
| 2018/0173588 | A1 | 6/2018 | Bacchus |
| 2019/0371391 | A1* | 12/2019 | Cha .................... G06F 11/1044 |
| 2021/0165721 | A1* | 6/2021 | Blagodurov .......... G06F 11/106 |

* cited by examiner

*Primary Examiner* — Michael Maskulinski
(74) *Attorney, Agent, or Firm* — Harness, Dickey & Pierce, P.L.C.

(57) ABSTRACT

A semiconductor memory device including a memory cell array and an error relief circuit may be provided. The memory cell array includes plurality of memory cells which store data and are coupled to a plurality of word-lines and a plurality of bit-lines. The error relief circuit includes a replacement memory. The error relief circuit receives a command and an address from an external device, stores a first data associated with a first address in the replacement memory in response to detecting a sequence of the consecutively received commands with respect to the first address, and inputs/outputs the first data associated with the first address through the replacement memory.

20 Claims, 16 Drawing Sheets

SEMICONDUCTOR MEMORY DEVICE AND MEMORY SYSTEM INCLUDING THE SAME

CROSS-REFERENCE TO RELATED APPLICATIONS

This U.S. non-provisional application claims priority under 35 U.S.C. § 119 to U.S. provisional application No. 62/867,440, filed on Jun. 27, 2019, the disclosure of which is incorporated by reference herein in its entirety.

BACKGROUND

Technical Field

Example embodiments of the present disclosure relate to memory devices, and more particularly, semiconductor memory devices and/or memory systems including the same.

Description of the Related Art

Semiconductor memory devices may be classified as non-volatile memory devices such as flash memory devices, and volatile memory devices such as dynamic random access memory (DRAM) devices. DRAM devices are often used for system memories due to their high speed operation and cost efficiency. Due to the continuing reduction in fabrication design rules of DRAM devices, bit errors of memory cells in DRAM devices may increase, and the yield of DRAM devices may decrease. Therefore, there are needs for increasing reliability of the semiconductor memory device.

SUMMARY

Some example embodiments of the present disclosure provide semiconductor memory devices capable of enhancing performance.

Some example embodiments of the present disclosure provide memory systems capable of enhancing performance.

According to an example embodiment, a semiconductor memory device includes a memory cell array, an error detection circuit, and an error relief circuit. The memory cell array includes plurality of memory cells configured to store data and coupled to a plurality of word-lines and a plurality of bit-lines. The error relief circuit includes a replacement memory. The error detection circuit may be configured to detect at least one bit error corresponding to a first address. The error relief circuit is configured to receive a command and an address from an external device, store a first data associated with the first address to the replacement memory in response to detecting a sequence of consecutively received commands with respect to the first address, and input/output the first data associated with the first address through the replacement memory.

According to an example embodiment, a memory system includes a plurality of semiconductor memory devices on a module board, a memory controller, and an error relief circuit. Each of the plurality of semiconductor memory devices may include a memory cell array including a plurality of memory cells, the plurality of memory cells configured to store data, and the plurality of memory cells coupled to a plurality of word-lines and a plurality of bit-lines, and an error detection circuit configured to detect at least one bit error corresponding to a first address. The error relief circuit includes a replacement memory. The error relief circuit is configured to receive a command and an address from the memory controller, store a first data associated with the first address to the replacement memory in response to detecting a sequence of the consecutively received commands with respect to the first address, and input or output the first data associated with the first address through the replacement memory.

According to an example embodiment, a semiconductor memory device includes a memory cell array and an error relief circuit. The memory cell array includes plurality of memory cells configured to store data and coupled to a plurality of word-lines and a plurality of bit-lines. The error relief circuit includes a replacement memory. The error relief circuit is configured to receive a command and an address from an external device, store a first data associated with a first address in the replacement memory in response to detecting a sequence of the consecutively received commands with respect to the first address, and input/output the first data associated with the first address through the replacement memory. The error relief circuit includes a command detection circuit and a storage circuit. The command detection circuit is configured to detect the sequence of the consecutively received command with respect to the first address. The storage circuit includes the replacement memory. The command detection circuit is configured to provide an error signal and the first address as a fail address to the storage circuit in response to detecting the sequence of the consecutively received command with respect to the first address. The command detection circuit further includes a content addressable memory (CAM) and a controller. The CAM is configured to store the first address as the fail address. The controller is configured to control the replacement memory and the CAM based on the error signal and the fail address.

According to some example embodiments, the semiconductor memory device does not include an error correction circuit and the memory controller is configured to apply a sequence of commands to a semiconductor memory device in response to detecting error in the data read from the semiconductor memory device. The error relief circuit in the semiconductor memory device is configured to detect the sequence of commands to recognize a status of the semiconductor memory device, determine whether the read data has an error and detect a hard fault. Therefore, the semiconductor memory device may reduce power consumption and prevent or mitigate processing overhead because the memory cell array does not store parity bits.

BRIEF DESCRIPTION OF THE DRAWINGS

The above and other features of the present disclosure will become more apparent by describing in detail example embodiments thereof with reference to the accompanying drawings.

DETAILED DESCRIPTION

Figure 1:
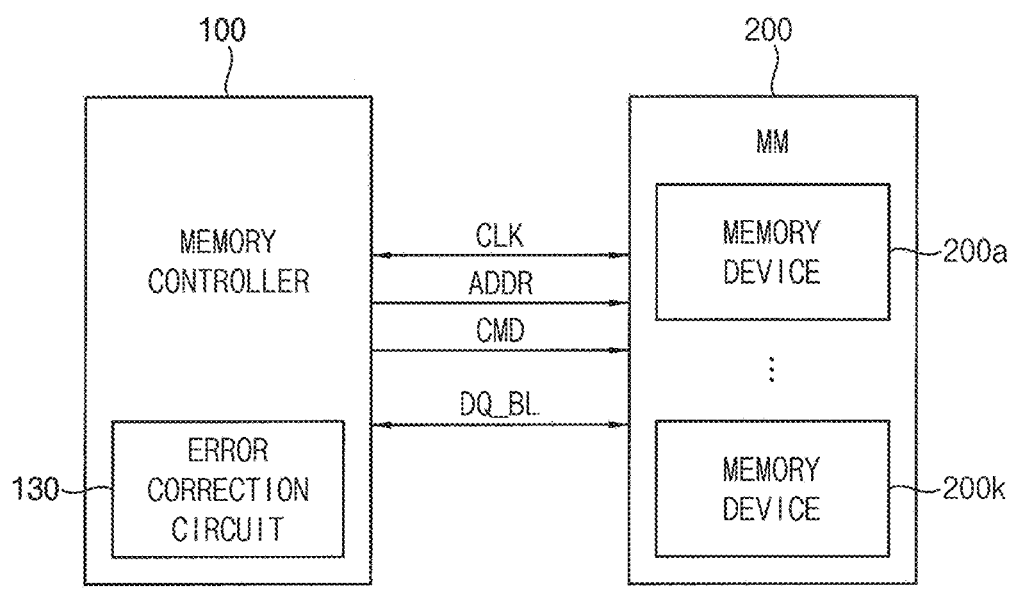
FIG. 1 is a block diagram illustrating a memory system according to an example embodiment.

Some example embodiments of the present disclosure will be described more fully hereinafter with reference to the accompanying drawings. Like reference numerals may refer to like elements throughout the accompanying drawings.

FIG. 1 is a block diagram illustrating a memory system according to an example embodiment.

Referring to FIG. 1, a memory system 20 may include a memory controller 100 (e.g., an external device) and a memory module 200. The memory module 100 may include a plurality of semiconductor memory devices 200a~200k mounted on a module board.

The memory controller 100 may control the overall operation of the memory system 20. The memory controller 100 may control the overall data exchange between an external host and the semiconductor memory devices 200a~200k. For example, the memory controller 100 may write data in the devices 200a~200k or read data from the semiconductor memory devices 200a~200k in response to a request from the host.

In some example embodiments, each of the semiconductor memory devices 200a~200k is a memory device including a plurality of volatile memory cells (e.g., DRAM cells) such as a dynamic random access memory (DRAM), double data rate 4 (DDR4) synchronous DRAM (SDRAM), or a stacked memory device such as a high bandwidth memory (HBM).

In some example embodiments, each of the semiconductor memory devices 200a~200k may be referred to as a memory device or a memory chip.

The memory controller 100 exchanges data set DQ_BL with memory module 200 based on a clock signal CLK. The memory controller 100 may transmit a command CMD and an address ADDR to each of the semiconductor memory devices 200a~200k.

The data set DQ_BL may correspond to a plurality of burst lengths, which is provided to/output from each of the semiconductor memory devices 200a~200k.

The memory controller 100 may include an error correction circuit 130 and the error correction circuit 130 may correct at least one error in the data set DQ_BL that has been provided from the memory module 200.

Each of the semiconductor memory devices 200a~200k may perform a burst operation. Herein, the burst operation refers to an operation of writing or reading a large amount of data by sequentially increasing or decreasing an initial address provided from the memory controller 100. A basic unit of the burst operation may be referred to a burst length BL.

Figure 2:
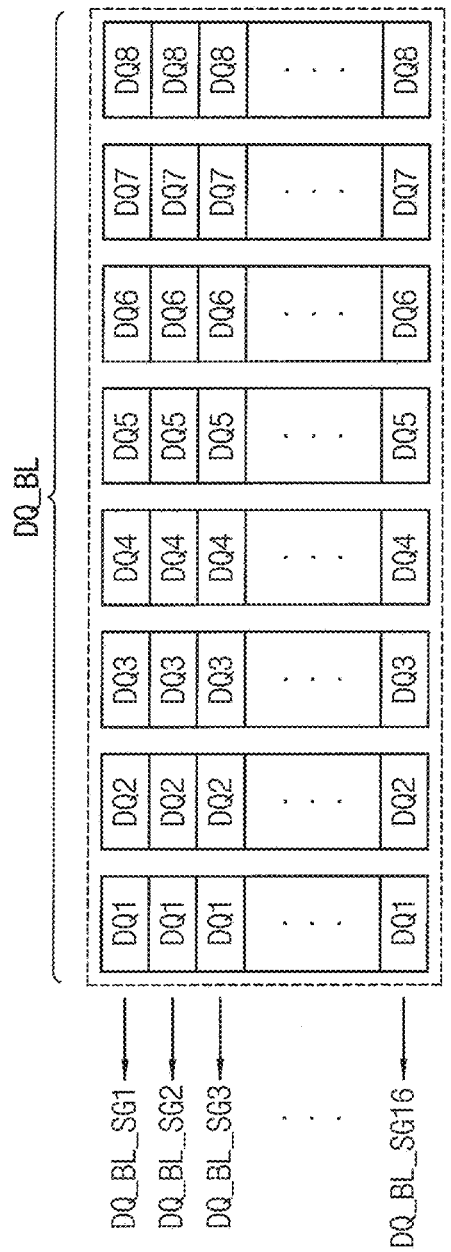
FIG. 2 illustrates a data set corresponding to a burst length in the memory system of FIG. 1 according to an example embodiment.

FIG. 2 illustrates a data set corresponding to a burst length in the memory system of FIG. 1 according to an example embodiment.

Referring to FIG. 2, the data set DQ_BL includes the plurality of unit data that are input to/output from each of the semiconductor memory devices 200a~200k. The data set DQ_BL includes data segments (or alternatively, unit data) DQ_BL_SG1~DQ_BL_SG16 each corresponding to the burst lengths. The burst length is assumed to be 8 in FIG. 2. However, example embodiments of the present disclosure are not limited thereto. The data set DQ_BL including the plurality of unit data of the burst length may be stored in memory cell array of each of the semiconductor memory devices 200a~200k.

Figure 3:
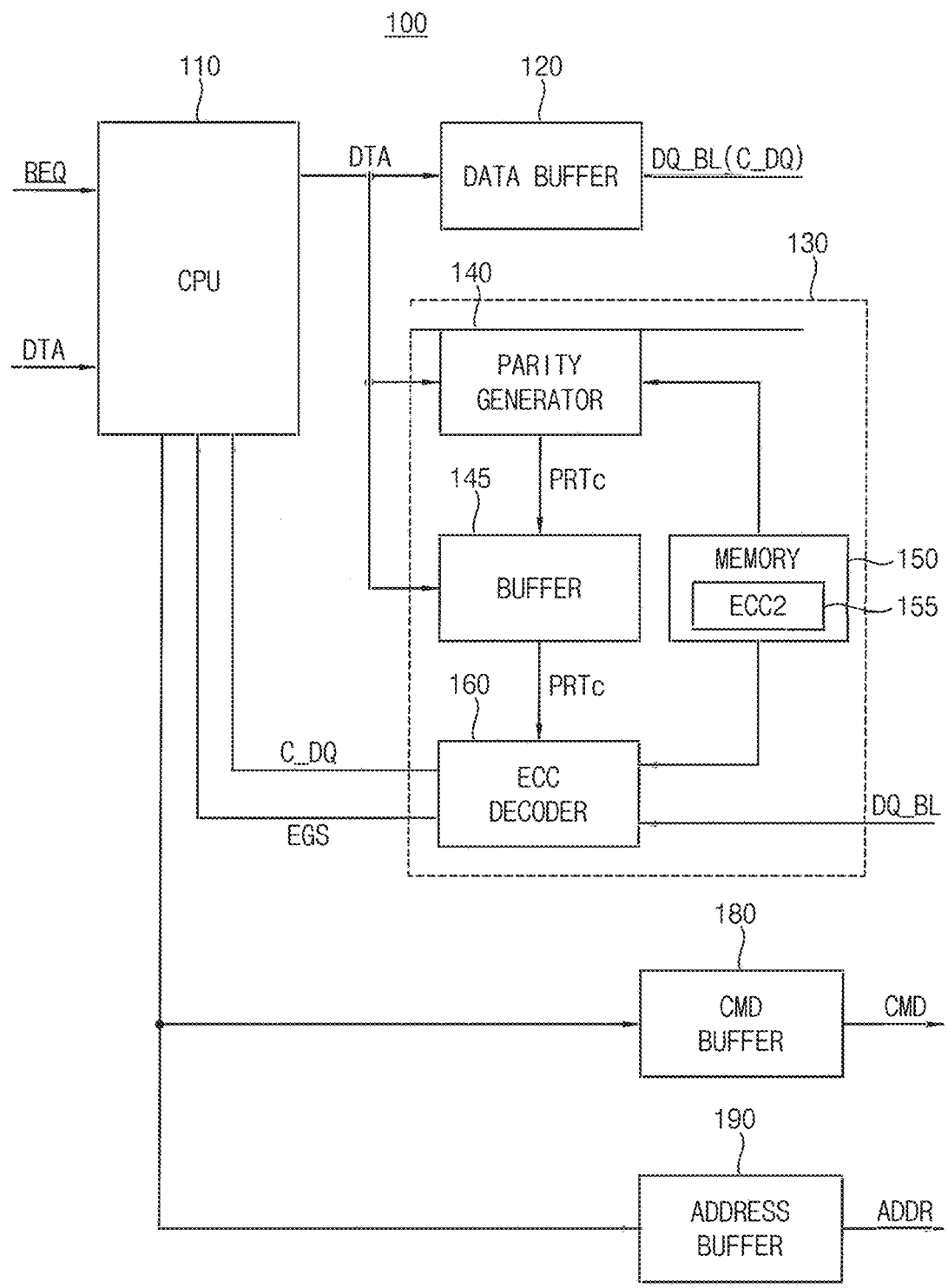
FIG. 3 is a block diagram illustrating the memory controller in FIG. 1 according to an example embodiment.

FIG. 3 is a block diagram illustrating the memory controller in FIG. 1 according to an example embodiment.

Referring to FIG. 3, the memory controller 100 may include a central processing unit (CPU) 110, a data buffer 120, the error correction circuit 130, a command buffer 180 and an address buffer 190. The error correction circuit 130 may include a parity generator 140, a buffer 145, a memory 150 that stores an error correction code (ECC) 155, and an ECC decoder 160. The error correction circuit 130 may be referred to as an error detection circuit.

The CPU 110 receives a request REQ and a data DTA from the host, and provides the data DTA to the data buffer 120 and the parity generator 140.

The data buffer 120 buffers the data DTA to provide the data set DQ_BL to the memory module 200.

The parity generator 140 is coupled to the memory 150, performs an ECC encoding on the data DTA using the ECC 155 to generate a parity data PRTc and stores the system parity data PRTc in the buffer 145.

The ECC decoder 160, in a read operation of the memory system 20, receives the data set DQ_BL from the memory module 200, performs an ECC decoding on the data set DQ_BL using the ECC 155 and the parity data PRTc, and may provide a corrected data C_DQ to the CPU 110. Further, the ECC decoder 160 provides an error generation signal EGS to the CPU 110 in response to detecting at least one error in the data set DQ_BL based on a result of the ECC decoding.

The CPU 110 may re-transmit the corrected data C_DQ (a first data) to a first semiconductor memory device which transmits the data including the at least one error by controlling the data buffer 120.

The command buffer 180 stores the command CMD corresponding to the request REQ, and transmits the command CMD to the memory module 200 under control of the CPU 110. The address buffer 190 stores the address ADDR, and transmits the address ADDR to the memory module 200 under control of the CPU 110.

The CPU 110 may control the command buffer 180 and the address buffer 190 such that the first semiconductor memory device performs a demand scrubbing, based on the error generation signal EGS. For performing the demand-scrubbing, the CPU 110 may control the command buffer 180 and the address buffer 190 such that read-read-write commands are sequentially issued with respect to a same address.

The error correction circuit 130 detects an error (at least one error bit) in the data received by the consecutive read commands, and in response to detecting the error consecutively, the CPU 110 controls the command buffer 180 and the address buffer 190 such that a write command and the corrected data C_DQ are transmitted to the first semiconductor memory device.

Figure 4:
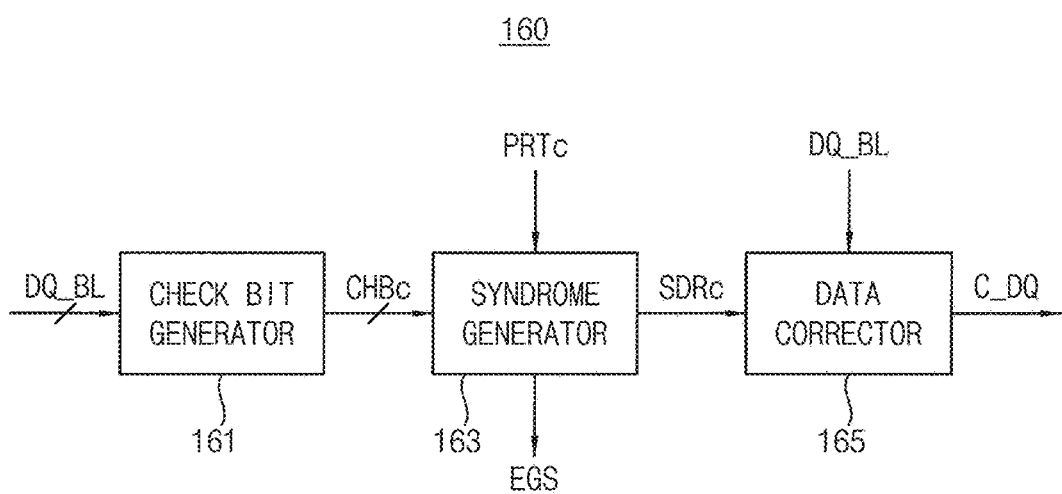
FIG. 4 is a block diagram illustrating an example of the ECC decoder in FIG. 3 according to an example embodiment.

FIG. 4 is a block diagram illustrating an example of the ECC decoder 160 in FIG. 3 according to an example embodiment.

Referring to FIG. 4, the ECC decoder 160 may include a check bit generator 161, a syndrome generator 163 and a data corrector 165.

The check bit generator 161 receives the data set DQ_BL, and generates check bits CHBc corresponding to the data set DQ_BL using the ECC 155.

The syndrome generator 163 compares the system parity data PRTc and the check bits CHBc to generate a syndrome data SDRc indicating whether the data set DQ_BL includes at least one error and indicating a position of the at least one error. The syndrome generator 163 also generates the error generation signal EGS.

The data corrector 165 receives the syndrome data SDRc from the syndrome generator 163, and corrects the at least one error in the syndrome data SDRc to output the corrected data C_DQ.

Figure 5:
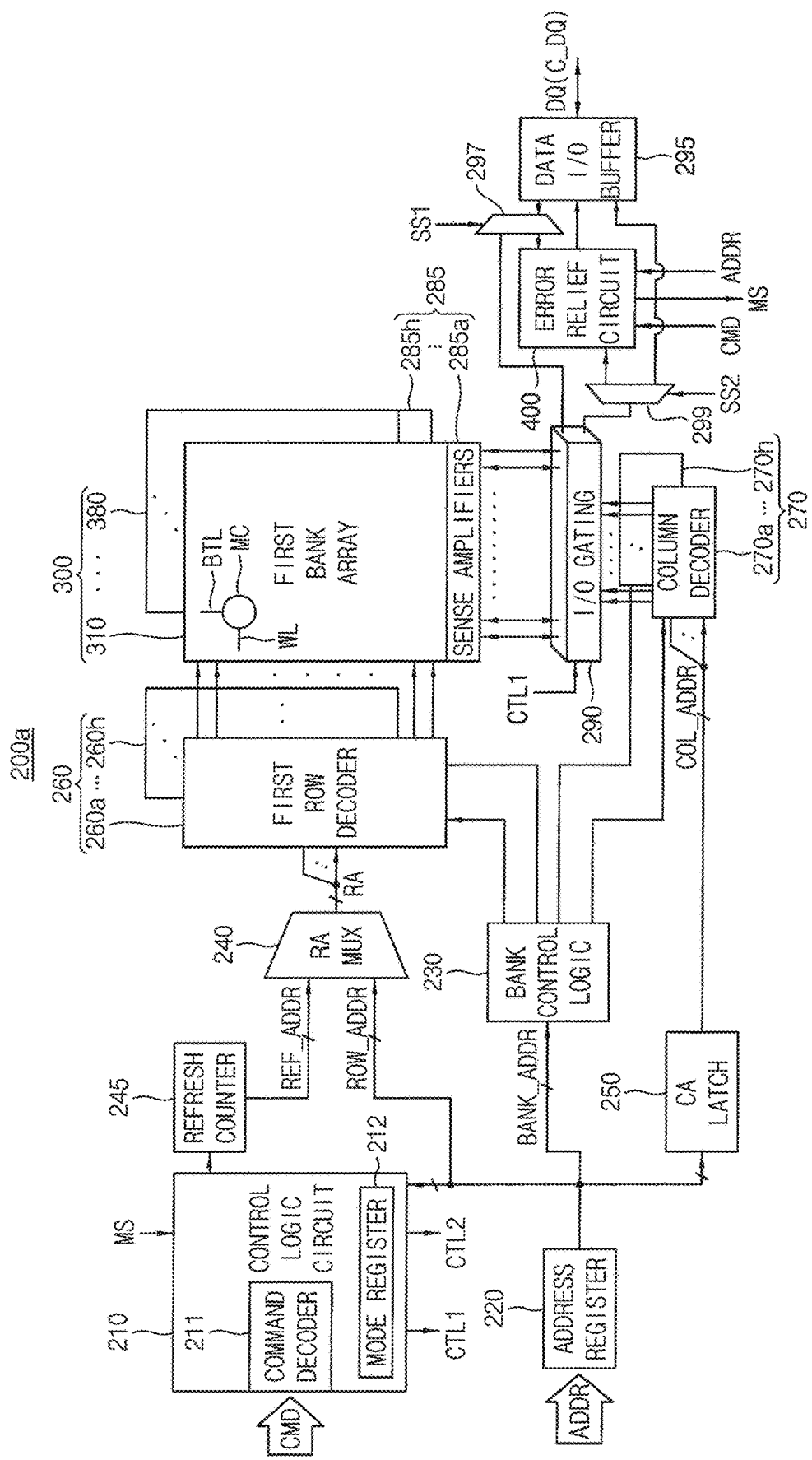
FIG. 5 is a block diagram illustrating one of the semiconductor memory devices in the memory module in the memory system of FIG. 1 according to an example embodiment.

FIG. 5 is a block diagram illustrating one of the semiconductor memory devices in the memory module in the memory system of FIG. 1 according to an example embodiment.

In FIG. 5, a configuration of the semiconductor memory device 200a is illustrated and each of the semiconductor memory devices 200b~200k has the same configuration as the semiconductor memory device 200a.

Referring to FIG. 5, the semiconductor memory device 200a includes a control logic circuit 210, an address register 220, a bank control logic 230, a row address multiplexer 240, a column address latch 250, a row address decoder 260, a column address decoder 270, a memory cell array 300, a sense amplifier circuit 285, an input/output (I/O) gating circuit 290, a data input/output (I/O) buffer 295, an error relief circuit 400, a first path control circuit 297 and a second path control circuit 299 and a refresh counter 245.

The memory cell array 300 includes first through eighth bank arrays 310~380. The row address decoder 260 includes first through eighth bank row address decoders 260a~260h coupled to the first through eighth bank arrays 310~380, respectively. The column address decoder 270 includes first through eighth bank column address decoders 270a~270h coupled to the first through eighth bank arrays 310~380, respectively. The sense amplifier circuit 285 includes first through eighth bank sense amplifiers 285a~285h coupled to the first through eighth bank arrays 310~380, respectively. The first through eighth bank arrays 310~380, the first through eighth bank row address decoders 260a~260h, the first through eighth bank column address decoders 270a~270h, and first through eighth bank sense amplifiers 285a~285h may form first through eighth banks. Each of the first through eighth bank arrays 310~380 includes a plurality of memory cells MC coupled to word-lines WL and bit-lines BTL.

Although the semiconductor memory device 200a is illustrated in FIG. 5 as including eight banks, example embodiments of the present disclosure are not limited thereto, and the semiconductor memory device 200a may include any number of banks.

The address register 220 receives an address ADDR including a bank address BANK_ADDR, a row address ROW_ADDR and a column address COL_ADDR, and a command CMD from the memory controller 100.

The address register 220 may provide the received bank address BANK_ADDR to the bank control logic 230, the received row address ROW_ADDR to the row address multiplexer 240, and the received column address COL_ADDR to the column address latch 250.

The bank control logic 230 may generate bank control signals in response to the bank address BANK_ADDR. One of the first through eighth bank row address decoders 260a~260h corresponding to the bank address BANK_ADDR may be activated in response to the bank control signals, and one of the first through eighth bank column address decoders 270a~270h corresponding to the bank address BANK_ADDR may be activated in response to the bank control signals.

The row address multiplexer 240 may receive the row address ROW_ADDR from the address register 220, and may receive a refresh row address REF_ADDR from the refresh counter 245. The row address multiplexer 240 may selectively output one of the row address ROW_ADDR the refresh row address REF_ADDR as a row address RA. The row address RA that is output from the row address multiplexer 240 may be applied to the first through eighth bank row address decoders 260a~260h.

The activated one of the first through eighth bank row address decoders 260a~260h may decode the row address RA that is output from the row address multiplexer 240, and may activate a word-line corresponding to the row address RA. For example, the activated bank row decoder may apply a word-line driving voltage to the word-line corresponding to the row address RA.

The column address latch 250 may receive the column address COL_ADDR from the address register 220, and may temporarily store the received column address COL_ADDR. In some example embodiments, in a burst mode, the column address latch 250 may generate column addresses that increment from the received column address COL_ADDR. The column address latch 250 may apply the temporarily stored or generated column addresses to the first through eighth bank column address decoders 270a~270h.

The activated one of the first through eighth bank column address decoders 270a~270h may decode the column address COL_ADDR that is output from the column address latch 250, and may control the input/output gating circuit 290 to output data corresponding to the column address COL_ADDR or a mapped column address MCA.

The I/O gating circuit 290 includes circuitry for gating input/output data. The I/O gating circuit 290 further includes read data latches for storing data that is output from the first through eighth bank arrays 310~380, and write drivers for writing data to the first through eighth bank arrays 310~380.

Data to be read from one bank array of the first through eighth bank arrays 310~380 may be sensed by a sense amplifier included in the sense amplifier circuit 285 and coupled to the one bank array from which the data is to be read, and may be stored in the read data latches. The data stored in the read data latches may be provided to the memory controller 100 via the data I/O buffer 295 in a normal mode.

Data (or the main data) DQ to be written in one bank array of the first through eighth bank arrays 310~380 may be provided to the data I/O buffer 295 from the memory controller 100. The main data MD is provided to the I/O gating circuit 290 in a normal mode and the I/O gating circuit 290 may write the data DQ in a target page of the memory cell array 300. Further, the data I/O buffer 295 may provide the corrected data C_DQ to the error relief circuit 400.

The error relief circuit 400 receives the command CMD and the address ADDR, stores the corrected data C_DQ (a first data) provided from the memory controller 100 in a replacement memory therein, and provides the control logic circuit 210 with a mode signal MS indicating an error relief mode, in response to detecting a desired (or alternatively, predetermined) sequence of the consecutively received commands CMD with respect to the same address (a first address) ADDR. The error relief circuit 400 inputs/outputs the first data associated with the first address through the replacement memory after entering into the relief mode.

The control logic circuit 210 may control operations of the semiconductor memory device 200a. For example, the control logic circuit 210 may generate control signals for the semiconductor memory device 200a to perform a write operation or a read operation. The control logic circuit 210 may include a command decoder 211 that decodes the command CMD received from the memory controller 100, and a mode register 212 that sets an operation mode of the semiconductor memory device 200a.

For example, the command decoder 211 may generate the control signals corresponding to the command CMD by decoding a write enable signal, a row address strobe signal, a column address strobe signal, a chip select signal, etc. The control logic circuit 210 may generate a first control signal CTL1 to control the I/O gating circuit 290 based on the command CMD and may generates a second control signal CTL2 to control the error relief circuit 400 based on the command CMD and the mode signal MS. The second control signal CTL2 may include selection signals SS1 and SS2.

The first path control circuit 297, in response to the selection signal SS1, may provide the data DQ provided from the data I/O buffer 295 to the I/O gating circuit 290 in the normal mode and may provide the corrected data C_DQ provided from the data I/O buffer 295 to the error relief circuit 400 in the error relief mode.

The second path control circuit 299, in response to the selection signal SS2, may provide the data DQ read from the memory cell array 300 to the data I/O buffer 295 in the normal mode and may provide the data DQ read from the memory cell array 300 to the error relief circuit 400 in the error relief mode.

Figure 6:
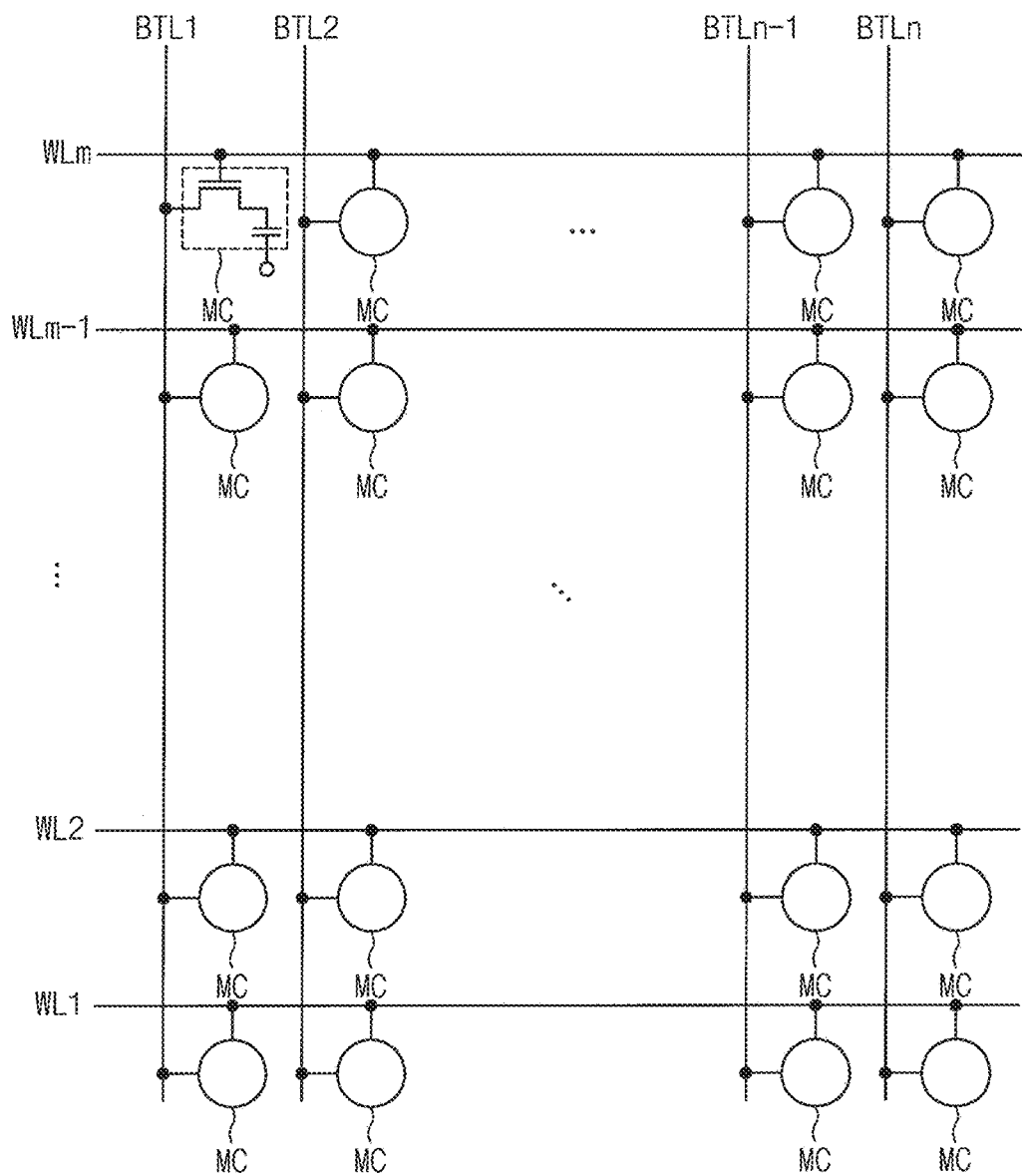
FIG. 6 illustrates an example of the first bank array in the semiconductor memory device of FIG. 5 according to an example embodiment.

FIG. 6 illustrates an example of the first bank array in the semiconductor memory device of FIG. 5 according to an example embodiment.

Referring to FIG. 6, the first bank array 310 includes a plurality of word-lines WL1~WLm (where m is a natural number greater than two), a plurality of bit-lines BTL1~BTLn (where n is a natural number greater than two), and a plurality of memory cells MCs disposed at intersections between the word-lines WL1~WLm and the bit-lines BTL1~BTLn.

Each of the memory cells MCs has a DRAM cell structure. Each of the memory cells MCs includes an access (cell) transistor coupled to a corresponding one of the word-lines WL1~WLm and a corresponding one of the bit-lines BTL1~BTLn and a storage (cell) capacitor coupled to the cell transistor. The plurality of word-lines WL1~WLm to which the plurality of memory cells MCs is connected may be defined as rows of the first bank array 310, and the plurality of bit-lines BTL1~BTLn to which the plurality of memory cells MCs is connected may be defined as columns of the first bank array 310.

Figure 7:
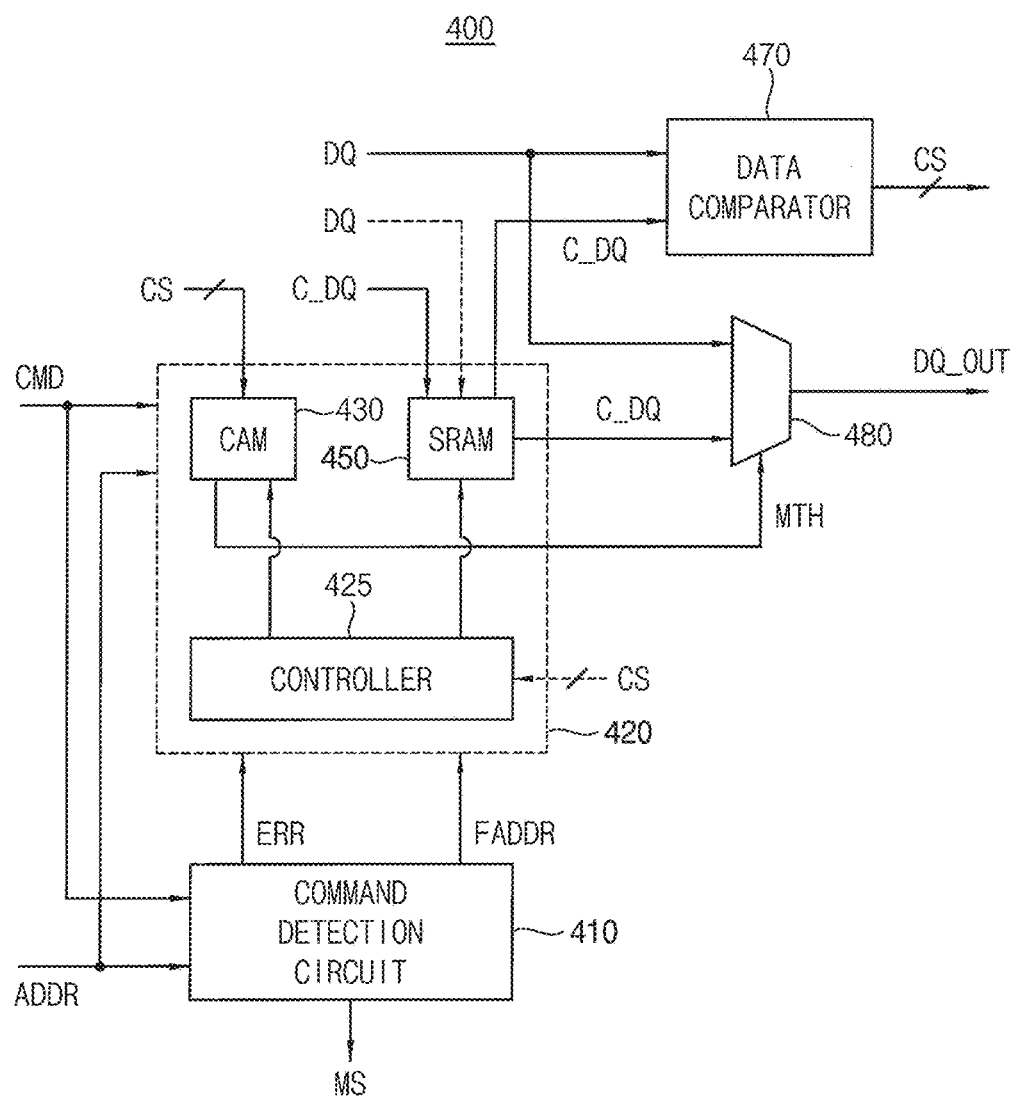
FIG. 7 is a block diagram illustrating an example of the error relief circuit in the semiconductor memory device of FIG. 5 according to an example embodiment.

FIG. 7 is a block diagram illustrating an example of the error relief circuit in the semiconductor memory device of FIG. 5 according to an example embodiment.

Referring to FIG. 7, the error relief circuit 400 includes a command detection circuit 410, a storage circuit 420, a data comparator 470 and a multiplexer 480.

The command detection circuit 410 receives the command CMD and the address ADDR, provides an error signal ERR and a first address as a fail address to the storage circuit 420 in response to detecting a desired (or alternatively, predetermined) sequence of consecutively received commands CMD, which indicates a demand scrubbing with respect to the same first address, and provides the control logic circuit 210 with the mode signal MS indicating the error relief mode. The desired (or alternatively, predetermined) sequence of the command with respect to the first address may correspond to read-read-write command sequence with respect to the first address.

The storage circuit 420 receives the address ADDR, the command CMD and the corrected data (first data) C_DQ and may include a content addressable memory (CAM) 430, an SRAM 450 and a controller 425.

In some example embodiments, the SRAM 450 may be referred to as a replacement memory.

The controller 425 may control the CAM 430 and the SRAM 450. The controller 425 controls the CAM 430 and the SRAM 450 such that the fail address FADDR is stored in the CAM 430, the corrected data C_DQ is stored in the SRAM 450 and the corrected data C_DQ is output from the SRAM 450 in response to the error signal ERR. The corrected data C_DQ is may be referred to as a first data.

Further, when the controller 425 determines memory cells (a memory location) designated by the first address that is repeatedly received in a consecutive manner as a hard fault, the controller 425 stores the data DQ provided from the memory controller 100 in the SRAM 450.

The CAM 430 may stores the fail address FADDR, compares the address ADDR from the memory controller 100 with the fail address FADDR after storing the fail address FADDR, and may provide the multiplexer 480 with a match signal MTH indicating whether the address ADDR (a second address) matches the fail address FADDR. Further, the CAM 430 may provide the match signal MTH to the multiplexer 480 in response to a comparison signal CS provided from the data comparator 470.

The multiplexer 480 may output one of the corrected data C_DQ (the first data) and the read data DQ (the second data) as an output data DQ_OUT in response to the match signal MTH. The multiplexer 480 may provide the output data DQ_OUT to the data I/O buffer 295 in FIG. 5.

The data comparator 470 may compare corresponding bits of the data (the second data) DQ read from the memory location designated by the first address in the memory cell array 300 and the corrected data (the first data) C_DQ output from the SRAM 450, and may provide the CAM 430 with the comparison signal CS indicating a result of the comparison. The data comparator 470 may provide the comparison signal CS to the controller 425.

Because there is a possibility that the read-read-write command sequence to the first address is caused by a normal operation, the data comparator 470 compares corresponding bits of the read data DQ and the corrected data C_DQ and provides the CAM 430 with the comparison signal CS with a logic high level indicating at least one corresponding bit of the read data DQ and the corrected data C_DQ is different.

The controller 425 may determine the memory location designated by the first address as a hard fault in response to the comparison signal CS with a logic high level and locks the SRAM 450 such that the first data associated with the first address is input/output to/from the SRAM until the semiconductor memory device 200a is powered-off.

Since the SRAM 450 stores unit data associated with the memory location (memory cells) in which the error is detected, a size of the SRAM 450 needs not to be very large. When compared with a case when the semiconductor memory device 200a includes an ECC engine, the size of the SRAM 450 may be relatively small with respect to overhead of the ECC engine and overhead of a parity region of the memory cell array 300.

In FIG. 7, the error relief circuit 400 storing the corrected data C-DQ by using the SRAM 450 is illustrated. In some example embodiments, the error relief circuit 400 stores the corrected data C-DQ by using a buffer, a different type of memory device or redundancy cells of the memory cell array 300 instead of the SRAM 450.

Figure 8:
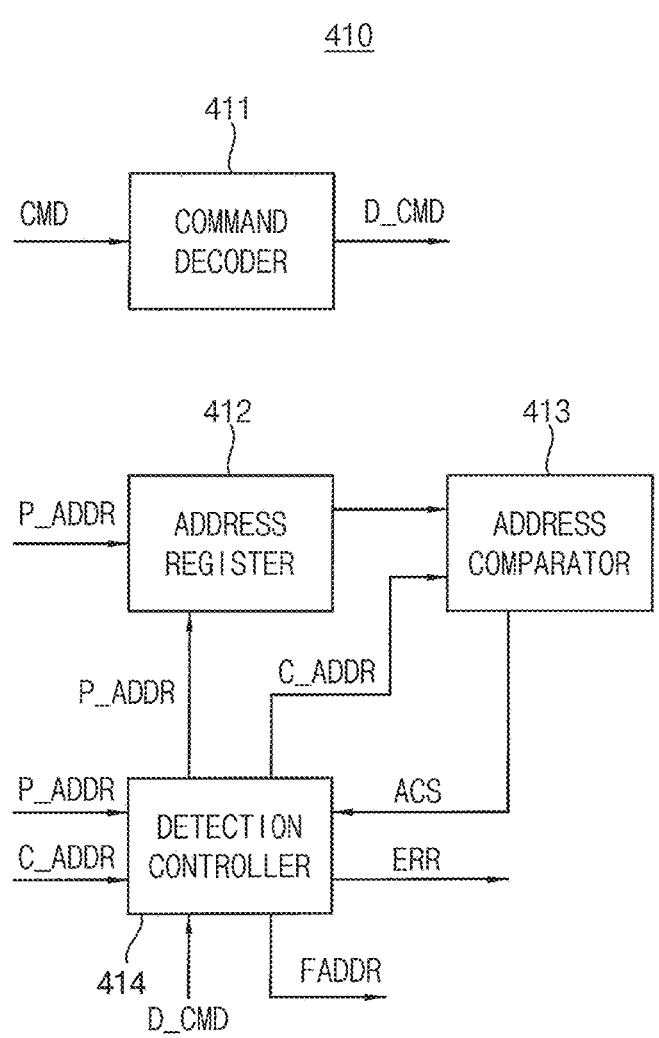
FIG. 8 is a block diagram illustrating an example of the command detection circuit in the error relief circuit in FIG. 7 according to an example embodiment.

FIG. 8 is a block diagram illustrating an example of the command detection circuit 410 in the error relief circuit in FIG. 7 according to an example embodiment.

Referring to FIG. 8, the command detection circuit 410 may include a command decoder 411, an address register 412, an address comparator 413 and a detection controller 414.

The command decoder 411 may decode the command CMD to provide a decoded command D_CMD. The decoded command D_CMD may indicate operation designated by the command CMD and the command decoder 411 may provide the decoded command D_CMD to the detection controller 414.

The address register 412 may store a previous address P_ADDR received just prior to a current address C_ADDR, which is provided from the detection controller 414. The address register 412 may store the current address C_ADDR when the address register 412 is updated by the detection controller 414. The address register 412 provides the previous address P_ADDR to the address comparator 413 under control of the detection controller 414.

The detection controller 414 receives the previous address P_ADDR to provide the previous register P_ADDR to the address register 412. The detection controller 414 receives the current address C_ADDR to provide the current address C_ADDR to the address comparator 413.

The address comparator 413 compares the current address C_ADDR with the previous address P_ADDR to provide the detection controller 414 with a comparison signal ACS indicating a result of the comparison.

The detection controller 414 receives the decoded command D_CMD, the previous address P_ADDR, the current address C_ADDR and the comparison signal ACS, and provides the storage circuit 420 with the fail address FADDR and the error signal ERR associated with the desired (or alternatively, predetermined) sequence, based on the decoded command D_CMD and the comparison signal ACS. Further, the detection controller 414 may control the address register 412.

For example, the detection controller 414 may output the error signal ERR and the current address C_ADDR as the fail address FADDR in response to the comparison signal ACS indicating that the current address C_ADDR is the same as the previous address P_ADDR consecutively two times and in response to the decoded command D_CMD indicating the desired (or alternatively, predetermined) sequence. Further, the detection controller 414 may determine a logic level of flag associated with the previous address P_ADDR and/or the current address C_ADDR.

In some example embodiments, the address register 412 and the address comparator 413 may be included in the detection controller 414.

Figure 9:
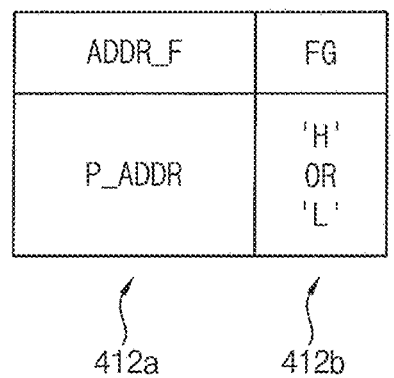
FIG. 9 illustrates an example of the address register in the command detection circuit of FIG. 8 according to an example embodiment.

FIG. 9 illustrates an example of the address register 412 in the command detection circuit 410 of FIG. 7 according to an example embodiments.

Referring to FIG. 9, the address register 412 may include a first column 412a and a second column 412b.

The first column 412a may correspond to an address field ADDR_F and the previous address P_ADDR may be stored in the address field ADDR_F. The first column 412a may correspond to a flag FG field, and in the flag FG field, a flag FG associated with the previous address P_ADDR may be stored with a logic high level 'H' or with a logic low level 'L'. The logic level of the flag FG may be associated with the desired (or alternatively, predetermined) command sequence.

Referring to FIGS. 8 and 9, if the decoded command D_CMD designates a read operation and the comparison signal ACS indicates that the current address C_ADDR is the same as the previous address P_ADDR, the detection controller 414 may active the flag FG associated with the previous address P_ADDR to a logic high level.

For example, if the decoded command D_CMD designates a read operation and the comparison signal ACS indicates that the current address C_ADDR is not the same as the previous address P_ADDR, the detection controller 414 may store the current address C_ADDR in the address register 412 and may update the address register 412 by deactivating the flag FG associated with the current address C_ADDR to a logic low level.

For example, if the decoded command D_CMD designates a write operation, the comparison signal ACS indicates that the current address C_ADDR is the same as the previous address P_ADDR and the flag FG associated with the previous address P_ADDR has a logic high level, which indicates that the desired (or alternatively, predetermined) sequence is detected, the detection controller 414 may active the error signal ERR and may store the current address C_ADDR in the CAM 430 as the fail address FADDR. The detection controller 414 may reset the address register 412 after storing the fail address FADDR in the CAM 430.

For example, if the decoded command D_CMD designates a write operation and the comparison signal ACS indicates that the current address C_ADDR is not the same as the previous address P_ADDR or if the decoded command D_CMD designates a write operation and the flag FG associated with the previous address P_ADDR has a logic low level, which indicates that the desired (or alternatively, predetermined) sequence is not detected, the detection controller 414 may reset the address register 412.

Figure 10:
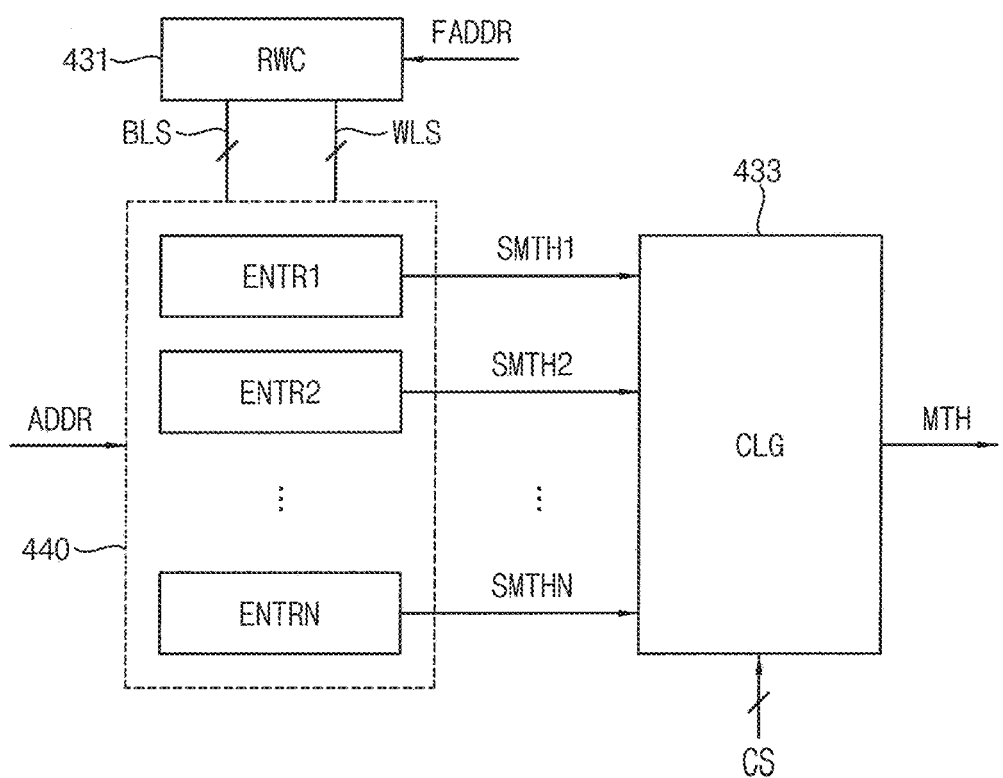
FIG. 10 is a block diagram illustrating an example of the CAM in the error relief circuit of FIG. 7 according to an example embodiment.

FIG. 10 is a block diagram illustrating an example of the CAM in the error relief circuit 400 of FIG. 7 according to an example embodiments.

Referring to FIG. 10, the CAM 430 may include a read-write circuit (RWC) 431, a CAM array 440, and a control logic (CLG) 433.

The CAM array 440 may store the fail address FADDR as a plurality of entry data ENTR1~ENTRN, may compares the address ADDR and each of the entry data ENTR1~ENTRN, and may provide the control logic CLG with sub match signals SMTH1~SMTHN. Each of the sub match signals SMTH1~SMTHN may indicate whether the address ADDR matches a corresponding one of the entry data ENTR1~ENTRN.

The read-write circuit 431 may be connected to the CAM array 440 through a plurality of bit-lines BLS and a plurality of word-lines WLS to write the entry data to the CAM array 440 or read the entry data stored in the CAM array 440. The read-write circuit 431 may write the fail address FADDR in the CAM array 440 as the entry data.

The control logic 433 may control the read-write circuit 431 and may output the match signal MTH with a first logic level if the at least one of the sub match signals SMTH1~SMTHN indicates that the address ADDR matches the fail address FADDR. Further, the control logic 433 may output the match signal MTH with a first logic level further based on the comparison signal CS indicating that the read data DQ is not the same as the corrected data C_DQ.

Figure 11:
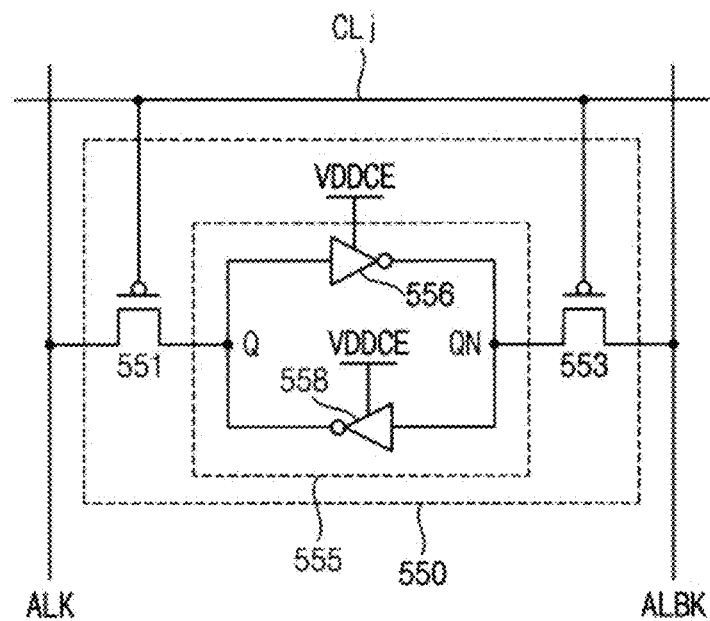
FIG. 11 illustrates one of SRAM cells that may constitute the SRAM in FIG. 7 according to an example embodiment.

FIG. 11 illustrates one of SRAM cells that may constitute the SRAM in FIG. 7 according to an example embodiment.

Referring to FIG. 11, an SRAM cell 550 may include a first access transistor 551, a second access transistor 553, and a data storage circuit 555. However, example embodiments are not limited thereto.

The data storage circuit 555 may store a single-bit of data, but example embodiments are not limited thereto. The data storage circuit 555 may include a first inverter 556 and a second inverter 558. An output terminal of the first inverter 556 is coupled to an input terminal of the second inverter 558, and an output terminal of the second inverter 558 is coupled to an input terminal of the first inverter 556. Therefore, the first inverter 556 and the second inverter 558 constitutes a latch circuit.

The first access transistor 551 may be connected between a specific access line (e.g., K-th access line ALK and a first node Q coupled to the input terminal of the first inverter 556. The first access transistor 551 includes a gate coupled to a control line CLj. The second access transistor 553 may be connected between a complementary access line of the K-th access line ALBK and a second node QN coupled to the input terminal of the second inverter 558. The second access transistor 553 includes a gate coupled to the control line CLj.

Figure 12:
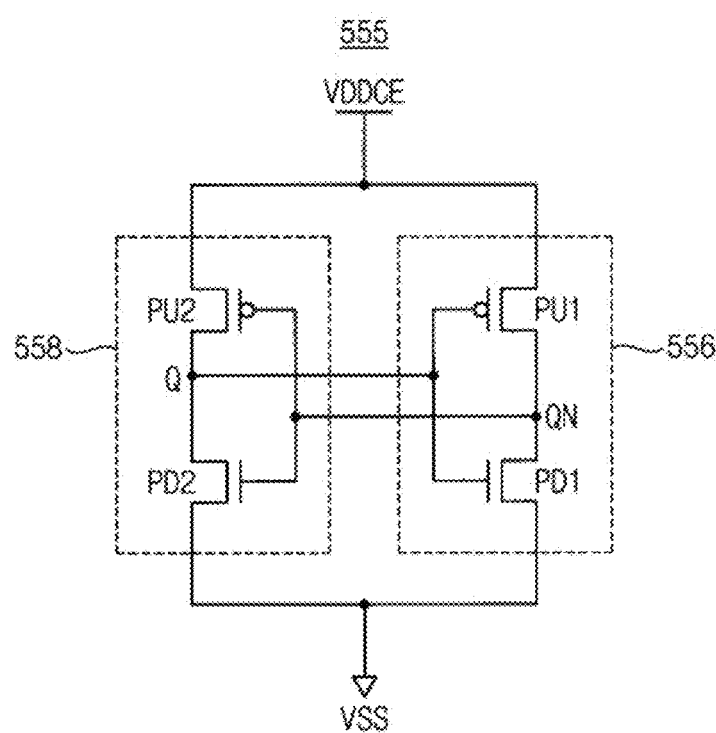
FIG. 12 is a circuit diagram illustrating a first inverter and a second inverter of the SRAM in FIG. 11.

FIG. 12 is a circuit diagram illustrating the first inverter 556 and the second inverter 558 of the SRAM in FIG. 11.

Referring to FIG. 12, the first inverter 556 includes a first pull-up transistor PU1 and a first pull-down transistor PD1. The second inverter 558 includes a second pull-up transistor PU2 and a second pull-down transistor PD2.

The first pull-up transistor PU1 may be a p-channel metal-oxide semiconductor (PMOS) transistor that includes a source coupled to the first power supply voltage VDDCE, a drain coupled to the second node QN, and a gate coupled to the first node Q. The first pull-down transistor PD1 may be a n-channel metal-oxide semiconductor (NMOS) transistor that includes a drain coupled to the second node QN, a source coupled to a ground voltage VSS, and a gate coupled to the first node Q. However, example embodiments are not limited thereto.

The second pull-up transistor PU2 may be a PMOS transistor that includes a source coupled to the first power supply voltage VDDCE, a drain coupled to the first node Q, and a gate coupled to the second node QN, but example embodiments are not limited thereto. The second pull-down transistor PD2 may be an NMOS transistor that includes a drain coupled to the first node Q, a source coupled to the ground voltage VSS, and a gate coupled to the second node QN, but example embodiments are not limited thereto. The first node Q may be coupled to the first access transistor 551 in FIG. 13 and the second node QN may be coupled to the second access transistor 553 in FIG. 11, but example embodiments are not limited thereto.

Figure 13:
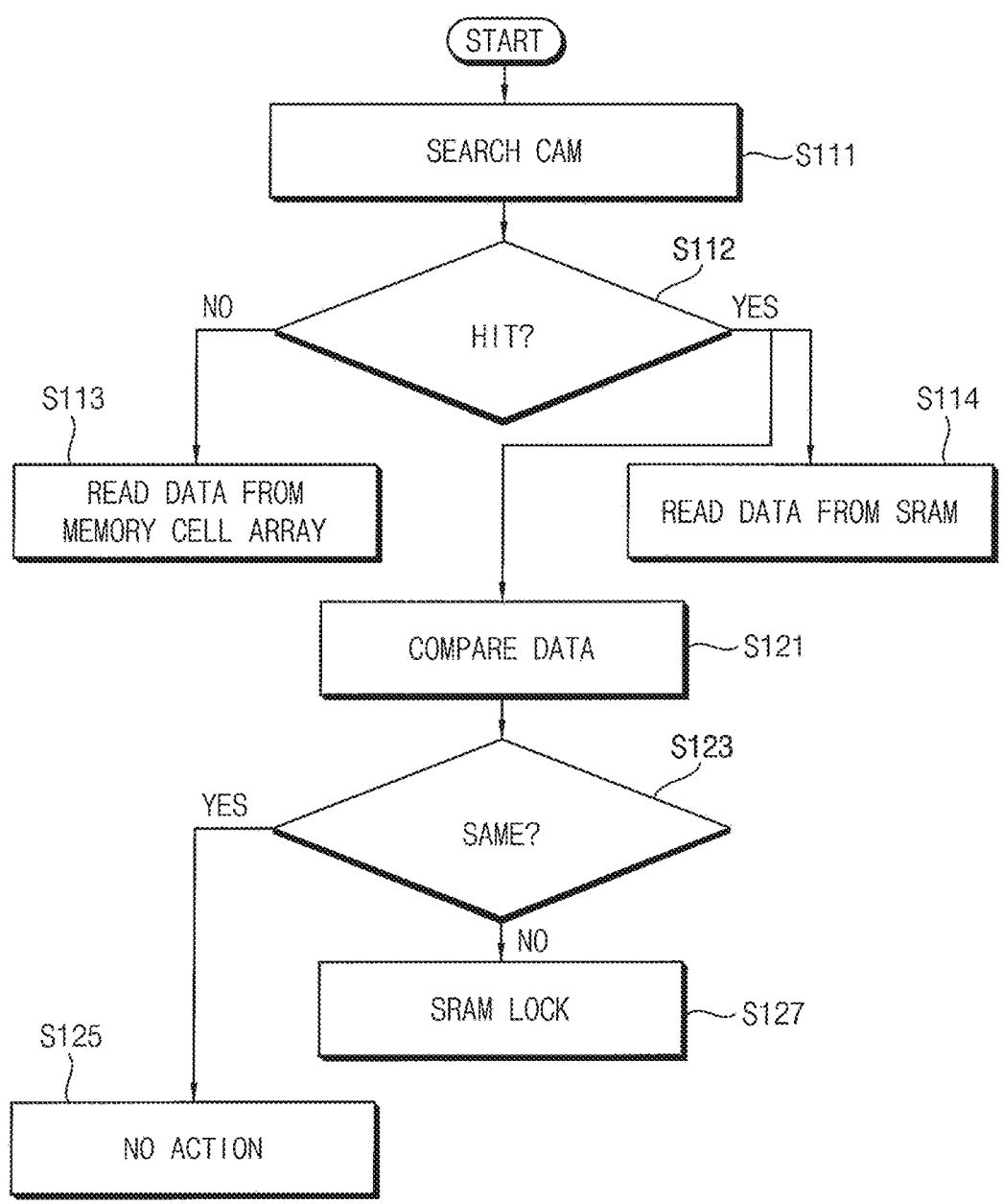
FIGS. 13 and 14 are flow charts illustrating operations of the error relief circuit of FIG. 7 based on a read command.
Figure 14:
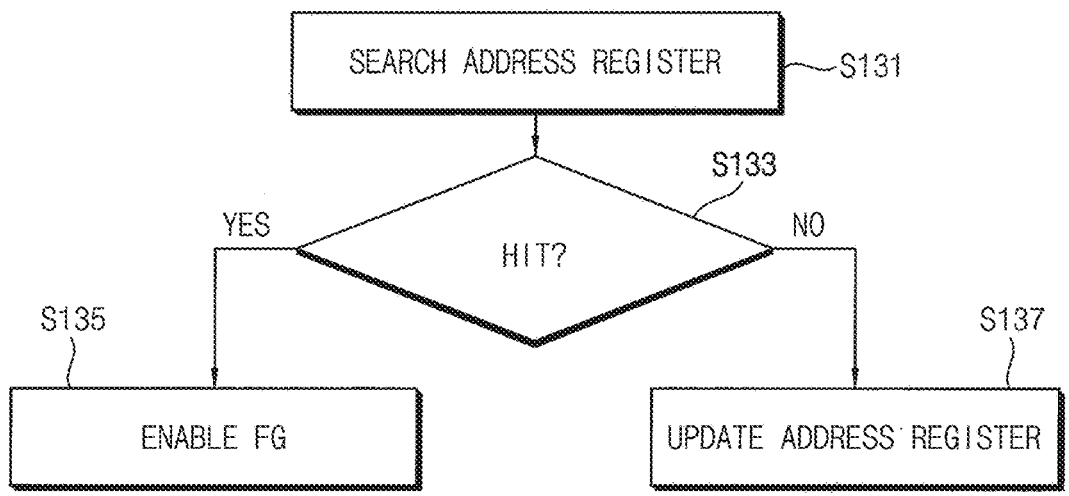

FIGS. 13 and 14 are flow charts illustrating operations of the error relief circuit 400 of FIG. 7 based on a read command.

FIG. 13 illustrates operation of the storage circuit 420 and the data comparator 470 in FIG. 7 based on the read command and FIG. 14 illustrates operation of the command detection circuit 410 in FIG. 7 based on the read command.

Referring to FIGS. 6 through 13, if the command CMD from the memory controller 100 designates the read operation, the CAM 430 searches the CAM array 440 based on the address ADDR received by the command CMD (S111) and determines whether the address ADDR matches (HIT) the fail address FADDR stored in the CAM array 440 (S112).

If the address ADDR does not match the fail address FADDR (NO in S112), the multiplexer 480 reads the second data DQ from the memory region designated by the address ADDR (S113) to provide the second data DQ to the data comparator 470. If the address ADDR matches the fail address FADDR (YES in S112), the multiplexer 480 reads the first data (the corrected data) C_DQ from the SRAM 450 (S114) to provide the first data C_DQ to the data comparator 470.

If the address ADDR matches the fail address FADDR (YES in S112), the data comparator 470 compares the first data C_DQ and the second data DQ (S121), and provides the controller 425 with the comparison signal CS indicating a result of the comparison.

The controller 425 determines whether the first data C_DQ is the same as the second data DQ based on the comparison signal CS (S123). If the first data C_DQ is the same as the second data DQ (YES in S123), the controller 425 does not change a logic level of the match signal MTH (S125) and the multiplexer 480 outputs one of the first data C_DQ and the second data DQ.

If the first data C_DQ is not the same as the second data DQ (NO in S123), the controller 425 adjust a logic level of the match signal MTH to a logic high level and locks the SRAM 450 (S127) and the multiplexer 480 outputs the first data C_DQ.

Referring to FIGS. 8 through 12 and 14, if the command CMD from the memory controller 100 designates the read operation, the detection controller 414 searches the address register 412 (S131) and the address comparator 413 compares the current address C_ADDR with the previous address P_ADDR to provide the detection controller 414 with the comparison signal ACS indicating a result of the comparison.

The detection controller 414 determines whether the current address C_ADDR is the same as the previous address P_ADDR based on the comparison signal ACS (S133).

If the current address C_ADDR is the same as the previous address P_ADDR (YES in S133), the detection controller 414 actives the flag FG, which is in the address register 412 and associated with the previous address P_ADDR to a logic high level (S135). If the current address C_ADDR is not the same as the previous address P_ADDR (NO in S133), the detection controller 414 updates the address register 412 by storing the current address C_ADDR in the address register 412 (S137).

Figure 15:
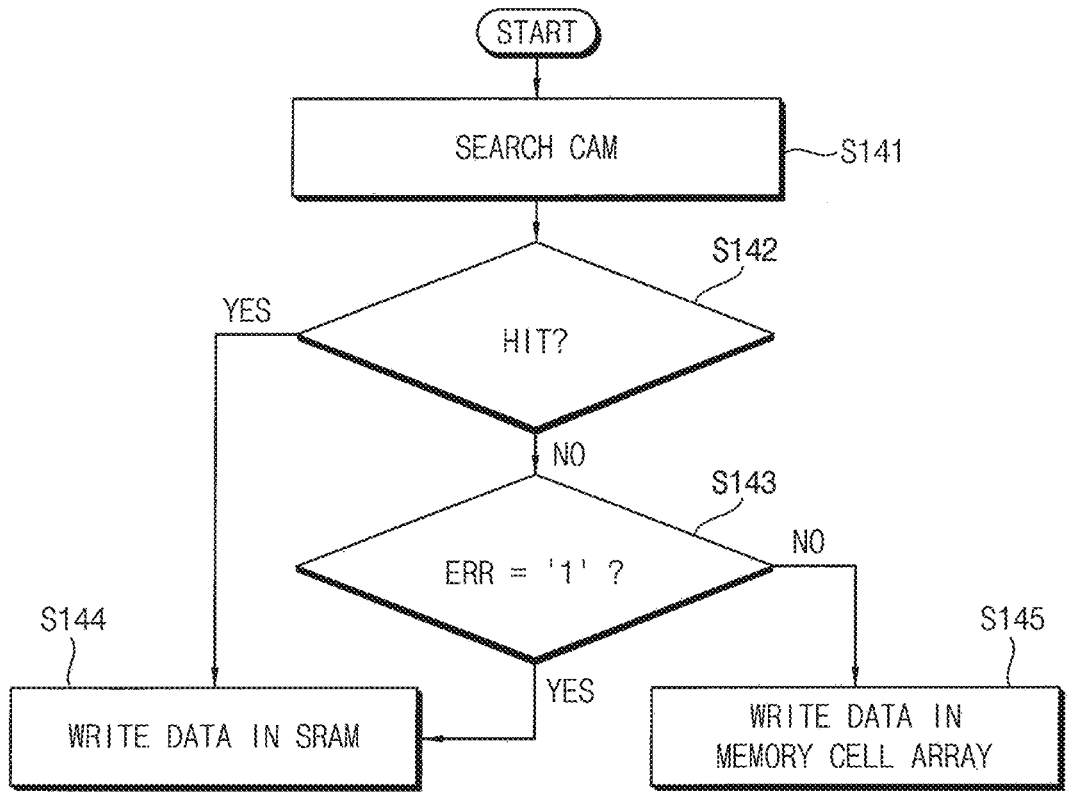
FIGS. 15 and 16 are flow charts illustrating operations of the error relief circuit of FIG. 7 based on a write command.
Figure 16:
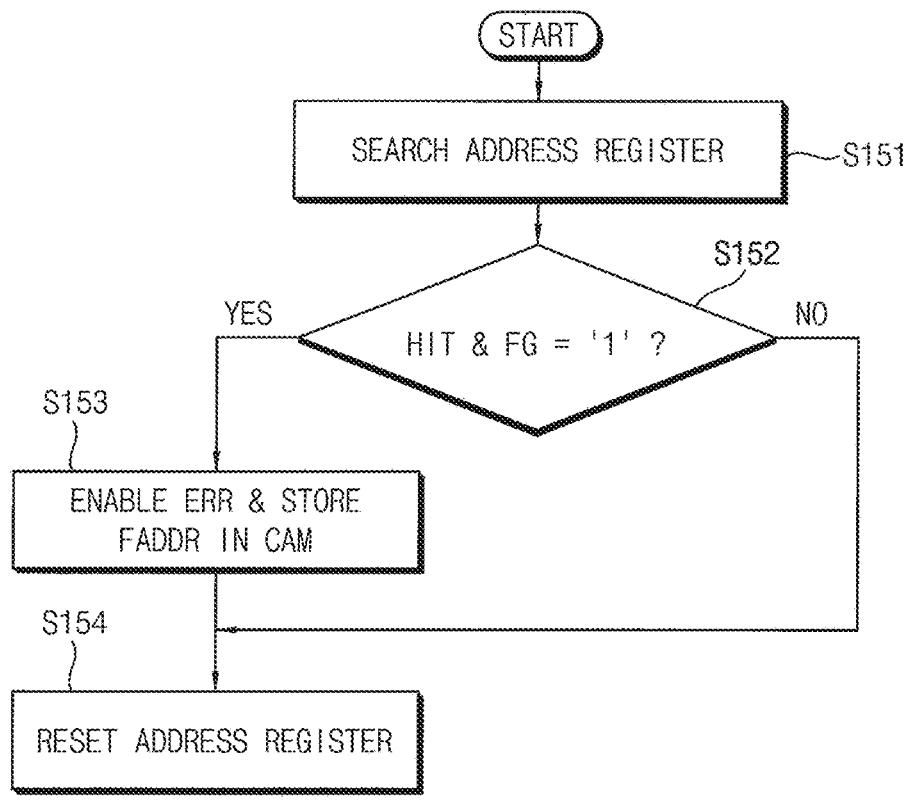

FIGS. 15 and 16 are flow charts illustrating operations of the error relief circuit of FIG. 5 based on a write command.

FIG. 15 illustrates operation of the storage circuit 420 in FIG. 7 based on the write command, and FIG. 16 illustrates operation of the command detection circuit 410 in FIG. 7 based on the write command.

Referring to FIGS. 7 through 12 and 15, if the command CMD from the memory controller 100 designates the write operation, the CAM 430 searches the CAM array 440 based on the address ADDR received by the command CMD (S141) and determines whether the address ADDR matches the fail address FADDR stored in the CAM array 440 (S142).

If the address ADDR matches the fail address FADDR (YES in S142), the data received by the write command is stored in the SRAM 450 (S144). If the address ADDR does not match the fail address FADDR (NO in S142), the controller 425 determines whether the error signal ERR has a first logic level (S143).

If the error signal ERR has a first logic level (YES in S143), the data received by the write command is stored in the SRAM 450 (S144). If the error signal ERR does not have a first logic level (NO in S143), the data received by the write command is stored in the memory location designated by the address ADDR in the memory cell array 300 (S145).

Referring to FIGS. 7 through 12 and 16, if the command CMD from the memory controller 100 designates the write operation, the detection controller 414 searches the address register 412 (S151) and the address comparator 413 compares the current address C_ADDR with the previous address P_ADDR to provide the detection controller 414 with the comparison signal ACS indicating a result of the comparison.

The detection controller 414 determines whether the current address C_ADDR is the same as the previous address P_ADDR based on the comparison signal ACS and determines whether the flag FG has a logic high level (S152).

If the current address C_ADDR is the same as the previous address P_ADDR and the flag FG has a logic high level (YES in S152), the detection controller 414 enables the error signal ERR and stores the current address C_ADDR in the CAM 430 as the fail address FADDR (S153).

After the fail address FADDR is stored in the CAM 430, the detection controller 414 resets the address register 412 (S154).

If the current address C_ADDR is not the same as the previous address P_ADDR or the flag FG does not have a logic high level (NO in S152), the detection controller 414 the detection controller 414 resets the address register 412 (S154).

Figure 17:
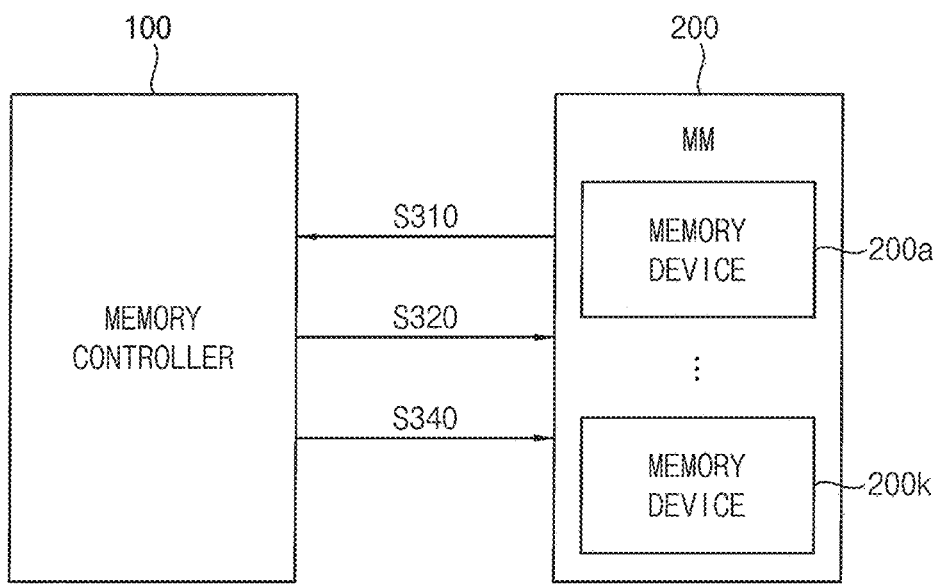
FIGS. 17 and 18 illustrate operation of the memory system of FIG. 1 according to an example embodiment.
Figure 18:
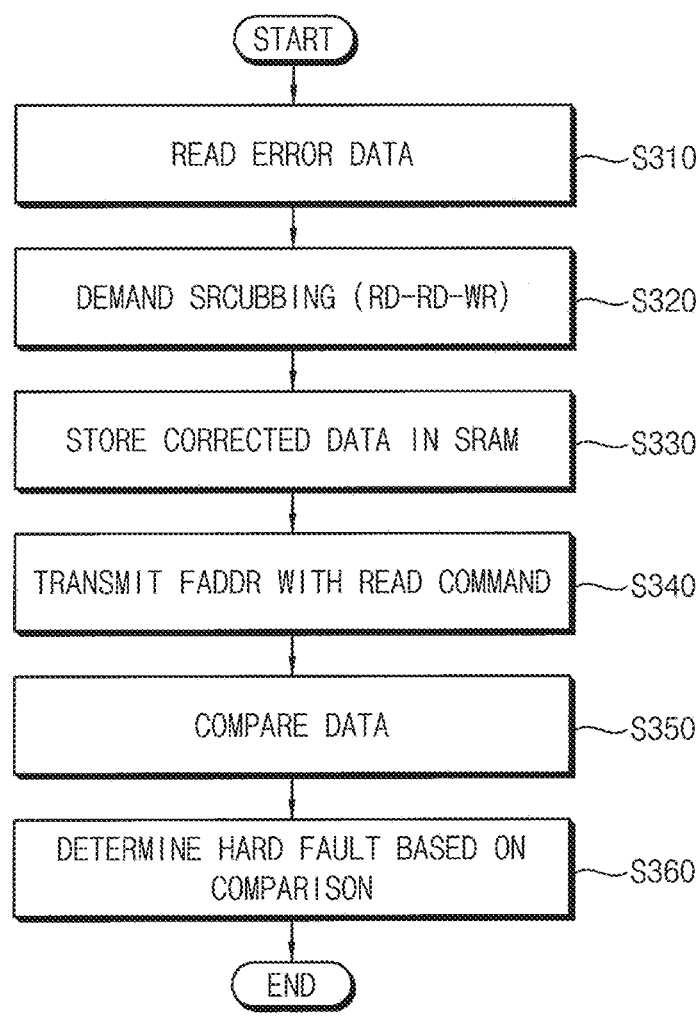

FIGS. 17 and 18 illustrate operation of the memory system of FIG. 1 according to example embodiments.

Referring to FIGS. 1 through 18, the memory controller 100 reads data set including at least one error from the memory module 200 (S310).

The error correction circuit 130 in the memory controller 100 detects an error in the read data set and issues a desired (or alternatively, predetermined) command sequence designating a demand scrubbing associated with a first address to a semiconductor memory device (a first semiconductor memory device 200a) which transmits data unit including the error (S320). The desired (or alternatively, predetermined) command sequence may correspond to read-read-write command sequence with respect to the first address.

The error relief circuit 400 in the first semiconductor memory device 200a detects the desired (or alternatively, predetermined) command sequence and stores the corrected data (a first data) C_DQ received with the write command in the SRAM 450 (S330).

After the corrected data C_DQ is stored in the SRAM 450, the memory controller 100 transmits the read command with the first address to the first semiconductor memory device 200a (S340).

The data comparator 470 in the error relief circuit 400 compares a second data read from the memory location designated by the first address with the corrected data (the first data) C_DQ stored in the SRAM 450 in response to the read command with respect to the first address (S350), and provides the controller 425 with the comparison signal CS indicating a result of the comparison.

The controller 425 determines whether the second data read from the memory location designated by the first address with the corrected data (the first data) C_DQ read from the SRAM 450 based on the comparison signal CS, determines the memory location as a hard fault if the second data is not the same as the first data (S360), and locks the SRAM 450. In some example embodiments, the error relief circuit 410 of FIG. 8 may be mounted on a module board instead of being included in each of the semiconductor memory devices 200a~200k. In this case, a memory system including an error detection circuit, a semiconductor memory device including the memory cell array, and the error relief circuit may be referred to as a semiconductor memory system.

Accordingly, in the semiconductor memory device and the memory system according to some example embodiments, the semiconductor memory device does not include an error correction circuit and the memory controller apply a desired (or alternatively, predetermined) command sequence to the semiconductor memory device in response to detecting error in the data read from the semiconductor memory device. The error relief circuit in the semiconductor memory device detects the command sequence to recognize a status of the semiconductor memory device, determines whether the read data has an error and detect a hard fault. Therefore, the semiconductor memory device may reduce power consumption and mitigate or prevent overhead because the memory cell array does not store parity bits.

Figure 19:
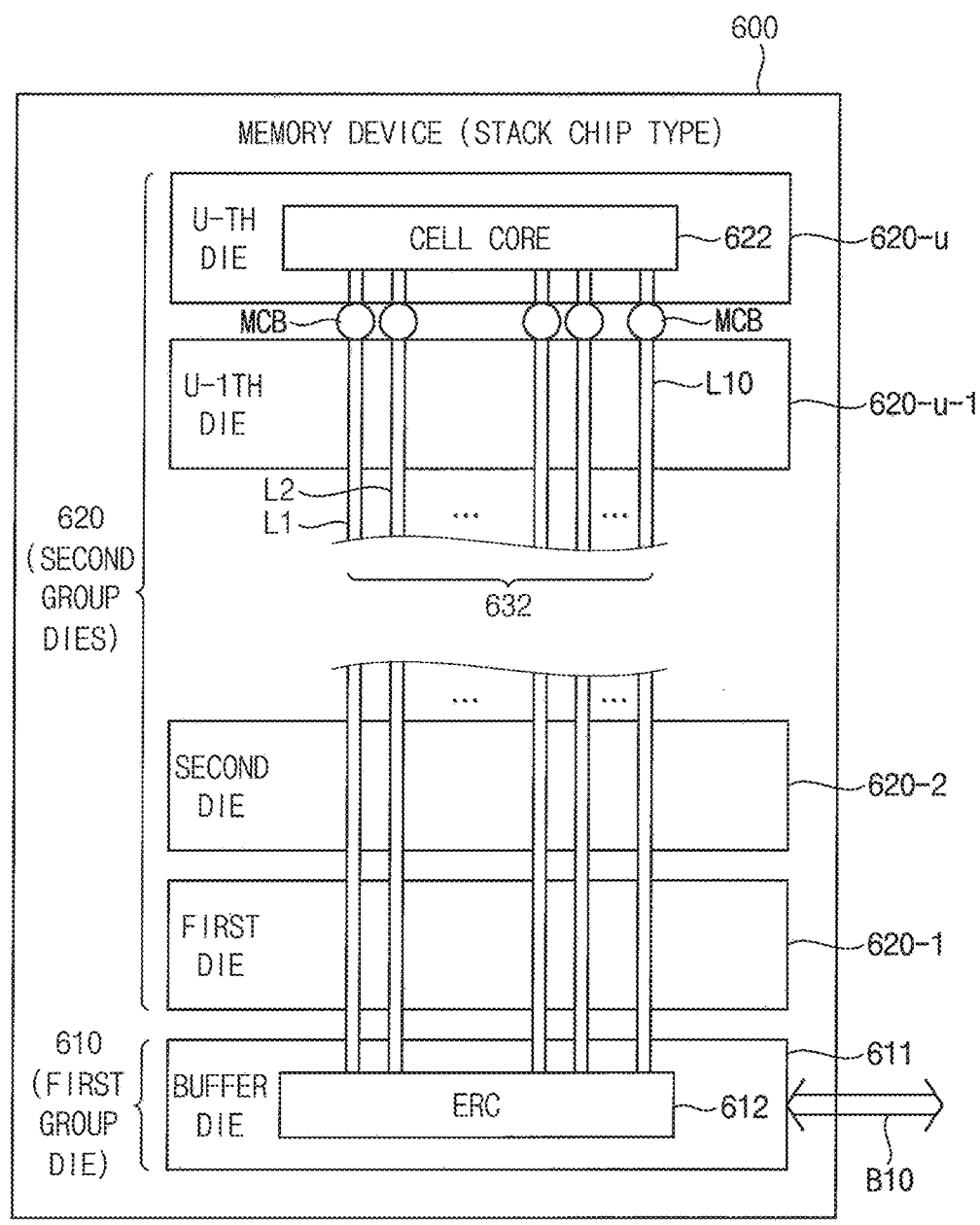
FIG. 19 is a block diagram illustrating a semiconductor memory device according to an example embodiment.

FIG. 19 is a block diagram illustrating a semiconductor memory device according to an example embodiment.

Referring to FIG. 19, a semiconductor memory device 600 may include a first group die 610 and second group dies 620 providing a stacked chip structure.

The first group die 610 may include at least one buffer die 611. The second group dies 620 may include a plurality of memory dies 620-1 to 620-$u$ ($u$ is a natural number greater than two) which is stacked on the buffer die 611 and convey data through a plurality of through silicon via (TSV) lines.

Each of the memory dies 620-1 to 620-$u$ may include a cell core 622 and the cell core 622 may include a memory cell array storing data, an I/O gating circuit, and a control logic circuit.

The buffer die 611 may include an error relief circuit 612 which detects a desired (or alternatively, predetermined)

command sequence designating the demand scrubbing. The error relief circuit 612 may employ the error relief circuit 400 of FIG. 5. Therefore, the error relief circuit 612 may input/output data through SRAM instead of memory cells in which the error is detected in response to detecting the desired (or alternatively, predetermined) command sequence.

The semiconductor memory device 600 may be a stack chip type memory device or a stacked memory device which conveys data and control signals through the TSV lines. The TSV lines may also be called through electrodes.

With the above description, a data TSV line group 632 which is formed at one memory die 620-u-1 may include TSV lines L1 to L10.

The TSV lines L1 to L10 of the data TSV line group 632 may be connected to micro bumps MCB which are correspondingly formed among the memory dies 620-1 to 620-u.

Each of the memory dies 620-1 to 620-u may include DRAM cells each including at least one access transistor and one storage capacitor.

The semiconductor memory device 600 may have a three-dimensional (3D) chip structure or a 2.5D chip structure to communicate with the host through a data bus B10. The buffer die 610 may be connected with the host through the data bus B10.

Although the error relief circuit 612 is included in the buffer die 611 in FIG. 18, the error relief circuit 612 may be included in each of the memory dies 620-1 to 620-u instead of the buffer die 611 in some example embodiments.

Each of the semiconductor memory devices 200a~200k may employ the semiconductor memory device 600 of FIG. 19.

Figure 20:
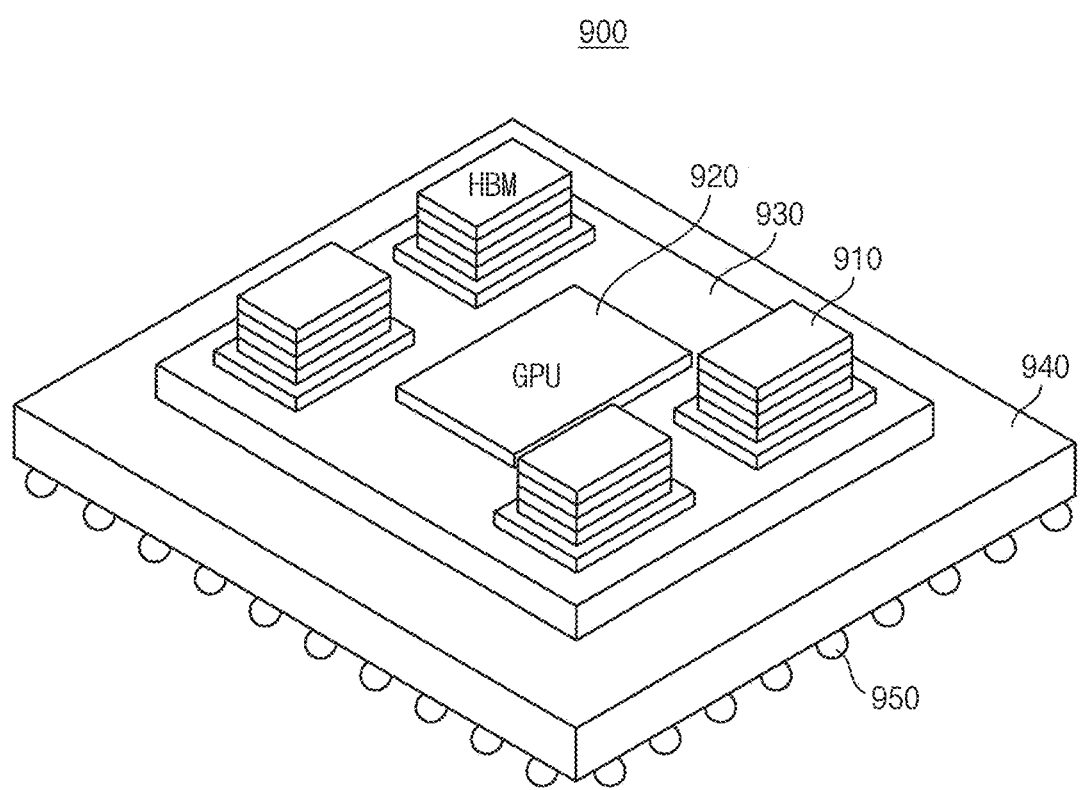
FIG. 20 is a diagram illustrating a semiconductor package including the stacked memory device according to an example embodiment.

FIG. 20 is a diagram illustrating a semiconductor package including the stacked memory device according to an example embodiment.

Referring to FIG. 20, a semiconductor package 900 may include one or more stacked memory devices 910 and a graphic processing unit (GPU) 920. The GPU 920 may include the memory controller 100 of FIG. 3.

The stacked memory devices 910 and the GPU 920 may be mounted on an interposer 930, and the interposer on which the stacked memory devices 910 and the GPU 920 are mounted may be mounted on a package substrate 940.

Each of the stacked memory devices 910 may be implemented in various forms, and may be a memory device in a high bandwidth memory (HBM) form in which a plurality of layers are stacked. Accordingly, each of the stacked memory devices 910 may include a buffer die and a plurality of memory dies. The buffer die may include an error relief circuit and each of the memory dies may include a memory cell array.

The error relief circuit may input/output data through SRAM instead of memory cells in which the error is detected in response to detecting the desired (or alternatively, predetermined) command sequence.

The plurality of stacked memory devices 910 may be mounted on the interposer 930, and the GPU 920 may communicate with the plurality of stacked memory devices 910.

For example, each of the stacked memory devices 910 and the GPU 920 may include a physical region, and communication may be performed between the stacked memory devices 910 and the GPU 920 through the physical regions. Meanwhile, when each of the stacked memory devices 910 includes a direct access region, a test signal may be provided to each of the stacked memory devices 910 through conductive means (e.g., solder balls 950) mounted under package substrate 940 and the direct access region.

As mentioned above, according to some example embodiments, the semiconductor memory device does not include an error correction circuit and the memory controller apply a desired (or alternatively, predetermined) command sequence to the semiconductor memory device in response to detecting error in the data read from the semiconductor memory device. The error relief circuit in the semiconductor memory device detects the command sequence to recognize a status of the semiconductor memory device, determines whether the read data has an error and detect a hard fault. Therefore, the semiconductor memory device may reduce power consumption and prevent overhead because the memory cell array does not store parity bits.

Example embodiments of the present disclosure may be applied to various systems employing a semiconductor memory device and a memory module including the semiconductor memory device described herein.

Various generators (e.g., parity generator, check bit generator, and syndrome generator), various decoders (e.g., ECC decoder, row address decoder, column address decoder, and command decoder), various comparators (e.g., data comparator and address comparator), various controllers (e.g., controller and detection controller), various control logics (e.g., bank control logic and control logic), data corrector, and/or address register disclosed in the present disclosure may be implemented as processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the present disclosure has been particularly shown and described with reference to some example embodiments thereof, it will be understood by those of ordinary skill in the art that various changes in form and detail may be made therein without departing from the spirit and scope of the present disclosure as defined by the following claims.

What is claimed is:

1. A semiconductor memory system comprising:
   a memory cell array including a plurality of memory cells, the plurality of memory cells configured to store data, and the plurality of memory cells coupled to a plurality of word-lines and a plurality of bit-lines;
   an error detection circuit configured to detect at least one bit error corresponding to a first address; and
   an error relief circuit including a replacement memory, the error relief circuit configured to receive a command and an address from an external device, the error relief circuit configured to store a first data associated with the first address to the replacement memory in response to detecting a sequence of consecutively received commands with respect to the first address, and the error relief circuit configured to input/output the first data associated with the first address through the replacement memory.

2. The semiconductor memory system of claim 1, wherein the error relief circuit includes:
   a command detection circuit configured to detect the sequence of the consecutively received commands with respect to the first address; and
   a storage circuit including the replacement memory.

3. The semiconductor memory system of claim 2, wherein
the command detection circuit is configured to provide an
error signal and the first address as a fail address to the
storage circuit in response to detecting the sequence of
the consecutively received commands with respect to
the first address, and
the storage circuit further includes,
a content addressable memory (CAM) configured to
store the first address as the fail address, and
a controller configured to control the replacement
memory and the CAM based on the error signal and
the fail address.

4. The semiconductor memory system of claim 3, wherein
the error relief circuit further includes:
a data comparator configured to provide the CAM with a
data comparison signal based on a second data and the
first data, the second data being data read from a
memory location designated by the first address in the
memory cell array; and
a multiplexer configured to output one of the first data and
the second data based on a match signal provided from
the CAM.

5. The semiconductor memory system of claim 4, wherein
the CAM is configured to provide the match signal to the
multiplexer in response to a second address from the external device matching the fail address.

6. The semiconductor memory system of claim 4, wherein
the data comparator is configured to provide the data
comparison signal to the controller, and
the controller is configured to determine the memory
location as a hard fault in response to the data comparison signal indicating that the first data is not the
same as the second data.

7. The semiconductor memory system of claim 2, wherein
the command detection circuit includes:
a command decoder configured to decode the command to
provide a decoded command;
an address register configured to store a previous address
received just prior to a current address;
an address comparator configured to output an address
comparison signal based on the current address and the
previous address; and
a detection controller configured to provide a fail address
and an error signal associated with the sequence based
on the decoded command, the current address, the
previous address, and the address comparison signal,
the detection controller configured to control the
address register.

8. The semiconductor memory system of claim 7, wherein
the detection controller is configured to output the error
signal and the current address as the fail address, in response
to the address comparison signal indicating that the current
address is the same as the previous address consecutively
two times and the decoded command indicating the
sequence.

9. The semiconductor memory system of claim 7, wherein
the address register includes:
an address field configured to store the previous address
and the current address; and
a flag field configured to store a flag associated with the
sequence.

10. The semiconductor memory system of claim 9,
wherein the detection controller is configured to activate the
flag associated with the previous address to a logic high
level, in response to the decoded command designating a
read operation and the address comparison signal indicating
that the current address is the same as the previous address.

11. The semiconductor memory system of claim 9,
wherein the detection controller is configured to store the
current address in the address register, in response to the
decoded command designating a read operation and the
address comparison signal indicating that the current address
is not the same as the previous address.

12. The semiconductor memory system of claim 9,
wherein the detection controller is configured to activate the
error signal and store the current address in the storage
circuit as the fail address, in response to the decoded
command designating a write operation, the address comparison signal indicating that the current address is the same
as the previous address, and the flag associated with the
previous address having a logic high level.

13. The semiconductor memory system of claim 9,
wherein the detection controller is configured to reset the
address register, in response to the decoded command designating a write operation and the address comparison signal
indicating that the current address is not the same as the
previous address or in response to the decoded command
designating the write operation and the flag associated with
the previous address having a logic low level.

14. The semiconductor memory system of claim 1,
wherein:
the sequence corresponds to read-read-write command
sequence with respect to the first address; and
the first data is received by a write command included in
the read-read-write command sequence.

15. The semiconductor memory system of claim 1,
wherein the replacement memory includes an SRAM.

16. A memory system comprising:
a plurality of semiconductor memory devices on a module
board, each of the plurality of semiconductor memory
devices including,
a memory cell array including a plurality of memory
cells, the plurality of memory cells configured to
store data, and the plurality of memory cells coupled
to a plurality of word-lines and a plurality of bit-lines, and
an error detection circuit configured to detect at least
one bit error corresponding to a first address,
a memory controller configured to control the plurality of
semiconductor memory devices; and
an error relief circuit including a replacement memory, the
error relief circuit configured to receive a command and
an address from the memory controller, the error relief
circuit configured to store a first data associated with
the first address to the replacement memory in response
to detecting a sequence of the consecutively received
commands with respect to the first address, and the
error relief circuit configured to input or output the first
data associated with the first address through the
replacement memory.

17. The memory system of claim 16, wherein the memory
controller includes:
an error correction circuit configured to detect at least one
error in data set, the data set including a plurality of unit
data from each of the semiconductor memory devices;
and
a central processing unit configured to transmit the first
data in which the at least one error is corrected to a
semiconductor memory device, from among the plurality of semiconductor memory devices, that has provided a unit data including the at least one error from
among the plurality of unit data.

18. The memory system of claim 16, wherein the error
relief circuit includes, a command detection circuit configured to detect the sequence of the consecutively received commands with respect to the first address, and a storage circuit including the replacement memory, the replacement memory including an SRAM.

19. The memory system of claim 16, wherein the replacement memory includes an SRAM.

20. A semiconductor memory device comprising:

a memory cell array including a plurality of memory cells, the plurality of memory cells configured to store data, and the plurality of memory cells coupled to a plurality of word-lines and a plurality of bit-lines; and an error relief circuit including a replacement memory, the error relief circuit configured to receive a command and an address from an external device, the error relief circuit configured to store a first data associated with a first address in the replacement memory in response to detecting a sequence of the consecutively received command with respect to the first address, and the error relief circuit configured to input/output the first data associated with the first address through the replacement memory, wherein the error relief circuit includes, a command detection circuit configured to detect the sequence of the consecutively received commands with respect to the first address, and a storage circuit including the replacement memory, wherein the command detection circuit is configured to provide an error signal and the first address as a fail address to the storage circuit in response to detecting the sequence of the consecutively received commands with respect to the first address, and wherein the command detection circuit further includes, a content addressable memory (CAM) configured to store the first address as the fail address, and a controller configured to control the replacement memory and the CAM based on the error signal and the fail address.

* * * * *